(12) United States Patent
Eccles et al.

(10) Patent No.: US 7,110,446 B1
(45) Date of Patent: Sep. 19, 2006

(54) METHOD AND APPARATUS FOR REDUCING EFFECT OF JITTER

(75) Inventors: Robert E. Eccles, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 793 days.

(21) Appl. No.: 10/206,243

(22) Filed: Jul. 26, 2002

(51) Int. Cl.
  *H04B 3/46* (2006.01)
  *H04B 17/00* (2006.01)
  *H04Q 1/20* (2006.01)

(52) U.S. Cl. ............... 375/226; 375/371; 375/375; 375/376; 370/516; 370/517; 370/518; 348/497; 369/44.32; 369/53.34; 713/400; 713/401; 713/500; 713/501; 713/503

(58) Field of Classification Search ............ 375/226, 375/371, 375, 376; 370/516, 517, 518; 348/497; 369/44.32, 53.34; 713/400, 401, 500, 501, 713/503
See application file for complete search history.

(56) References Cited

U.S. PATENT DOCUMENTS

| | | | | |
|---|---|---|---|---|
| 4,320,526 A | * | 3/1982 | Gitlin | 375/371 |
| 5,481,563 A | * | 1/1996 | Hamre | 375/226 |
| 5,719,907 A | * | 2/1998 | Kaku et al. | 375/371 |
| 5,727,037 A | * | 3/1998 | Maneatis | 375/376 |
| 5,796,673 A | * | 8/1998 | Foss et al. | 365/233 |
| 5,936,912 A | * | 8/1999 | Kawabata et al. | 365/233 |
| 6,118,319 A | * | 9/2000 | Yamada et al. | 327/291 |
| 6,140,854 A | * | 10/2000 | Coddington et al. | 327/158 |
| 6,289,068 B1 | | 9/2001 | Hassoun et al. | |
| 6,295,315 B1 | * | 9/2001 | Frisch et al. | 375/226 |
| 2003/0218486 A1 | * | 11/2003 | Kwak | 327/158 |

OTHER PUBLICATIONS

Eric W. Weisstein. "Moving Average." From MathWorld—A Wolfram Web Resource. http://mathworld.wolfram.com/MovingAverage.html, 1999 CRC Press LLC.*
Eric W. Weisstein. "Velocity." From MathWorld—A Wolfram Web Resource.. http://mathworld.wolfram.com/MovingAverage.html, 1999 CRC Press LLC.*
Eric W. Weisstein. "Statistical Median." From MathWorld—A Wolfram Web Resource. http://mathworld.wolfram.com/StatisticalMedian.html, 1999 CRC Press LLC.*

* cited by examiner

*Primary Examiner*—Chieh M. Fan
*Assistant Examiner*—Nader Bolourchi
(74) *Attorney, Agent, or Firm*—W. Eric Webostad

(57) ABSTRACT

Method and apparatus for reducing effect of jitter is described. More particularly, one or more taps of a delay line are selected for a reference clock signal. These selected taps each have an associated index, which is stored, and stored indices are statistically processed to select a tap of another delay line.

13 Claims, 4 Drawing Sheets

METHOD AND APPARATUS FOR REDUCING EFFECT OF JITTER

FIELD OF THE INVENTION

The present invention relates generally to reduce effect of jitter, and more particularly to reducing dither of a delay-lock loop.

BACKGROUND OF THE INVENTION

Use of one or more clock signals to synchronize events of digital systems is well known. However, due to clock buffer delays, compacitively loaded clock signal lines, and another signal propagation delays, a time difference may be introduced between a rising or falling edge in one part of a system as compared with a corresponding rising or falling edge, respectively, in another part of the same system. This difference is known as clock skew. In order to address the problem of clock skew, others have proposed using a delay-lock loop. For example, a delay-lock loop is used in U.S. Pat. No. 6,289,068 B1 by Hassoun, et al., in order to deskew a clock signal. In Hassoun, et al., a tap of a delay line is selected in order to mitigate against clock skew. However, accurate tap selection is dependent on a phase detector.

Jitter or phase noise is a well-studied phenomenon in circuit implementation. Accordingly, if an input signal, such as a reference clock signal, is provided to a delay-lock loop ("DLL"), jitter associated with such an input signal can introduce uncertainty with respect to such clockage. More particularly, jitter can cause a phase detector to incorrectly detect whether a signal is leading or lagging. This incorrect detection can lead to the selection of an incorrect tap of a delay line for deskewing a clock.

Accordingly, an inaccurate clock deskew may preclude adjusting a clock signal to one period of a desired frequency. Thus, selection of taps may need to be made to provide a clock period which is longer than that desired or latency may be introduced. Moreover, a jitter can cause dither of selection of such taps, thus further destabilizing a digital system. Additionally, jitter caused by a source external to a unit under test, such as a microchip, can cause a passing part to erroneously fail.

Accordingly, it would be both desirable and useful to provide method and apparatus for reducing effect of jitter in order to reduce dither, as well as to enhance accuracy of a DLL.

SUMMARY OF THE INVENTION

An aspect of the present invention is a method for reducing effect of jitter. A reference clock signal is received. A first tap of the first delay line is selected. A reference value associated with the tap selected is stored. The reference value is statistically processed to provide a statistical value output. A second tap of a second delay line is selected in response to the statistical value output.

An aspect of the present invention is an apparatus to reduce effect of jitter. A first delay-lock loop is coupled to receive a reference signal and configured to provide a tap selected signal in response to the reference signal. A statistical processor is coupled to the first delay-lock loop to receive the tap selected signal and configured to provide a tap select signal in response to the tap selected signal. The tap select signal is statistically determined from a history of tap selected signals. A second delay-lock loop is coupled to receive the tap select signal and configured to provide an output clock signal in response to the tap select signal.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
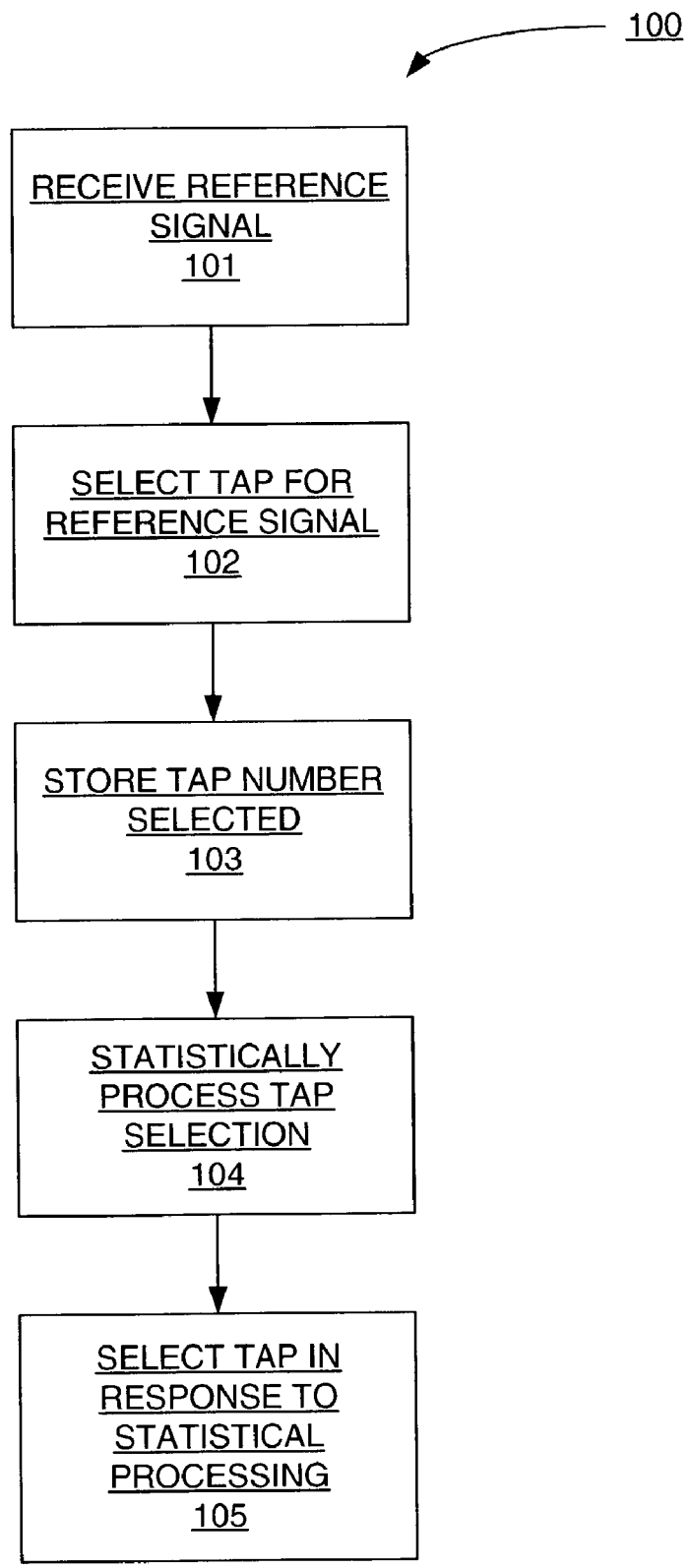
FIG. 1 is a block diagram of an exemplary embodiment of a tap selection process in accordance with one or more aspects of the invention.

FIG. 1 is a block diagram of an exemplary embodiment of a tap selection process 100 in accordance with one or more aspects of the invention. In step 101, a reference signal is received. The reference signal may be a reference strobe or clock signal. In step 102, a tap is selected in response to the reference signal received. A tap may be from a delay line associated with a delay-lock loop. In step 103, a tap number associated with the tap selected is stored. As is known, a delay line may comprise a plurality of taps. For example, a delay line may have 256 taps numbered from zero to 255. A delay-lock loop is used to lock onto a received reference signal, such as in step 101, at a particular phase relationship. This phase relationship may be at 0°, 90°, 180°, or 270°, or any other desired phase dependent upon the granularity of the delay line.

As one or more tap numbers selected are stored at step 103, they may be statistically processed at step 104. This is particularly significant with respect to jitter on a received reference signal at step 101. Jitter can cause a phase detector of a delay-lock loop to incorrectly select a tap. However, by storing a number of tap selections over a period of time, a histogram, running average, actual mean, actual median, or other statistical resolution may be used as a "smoothing" tap selection function. Accordingly, erroneous changes in tap selection due to jitter may be avoided.

After statistically processing tap selection at step 104, a tap is selected in response to such statistical processing at step 105. Such a tap may be selected to reduce an effect of jitter. More particularly, effects of jitter may be reduced, as described below in more detail.

Figure 2:
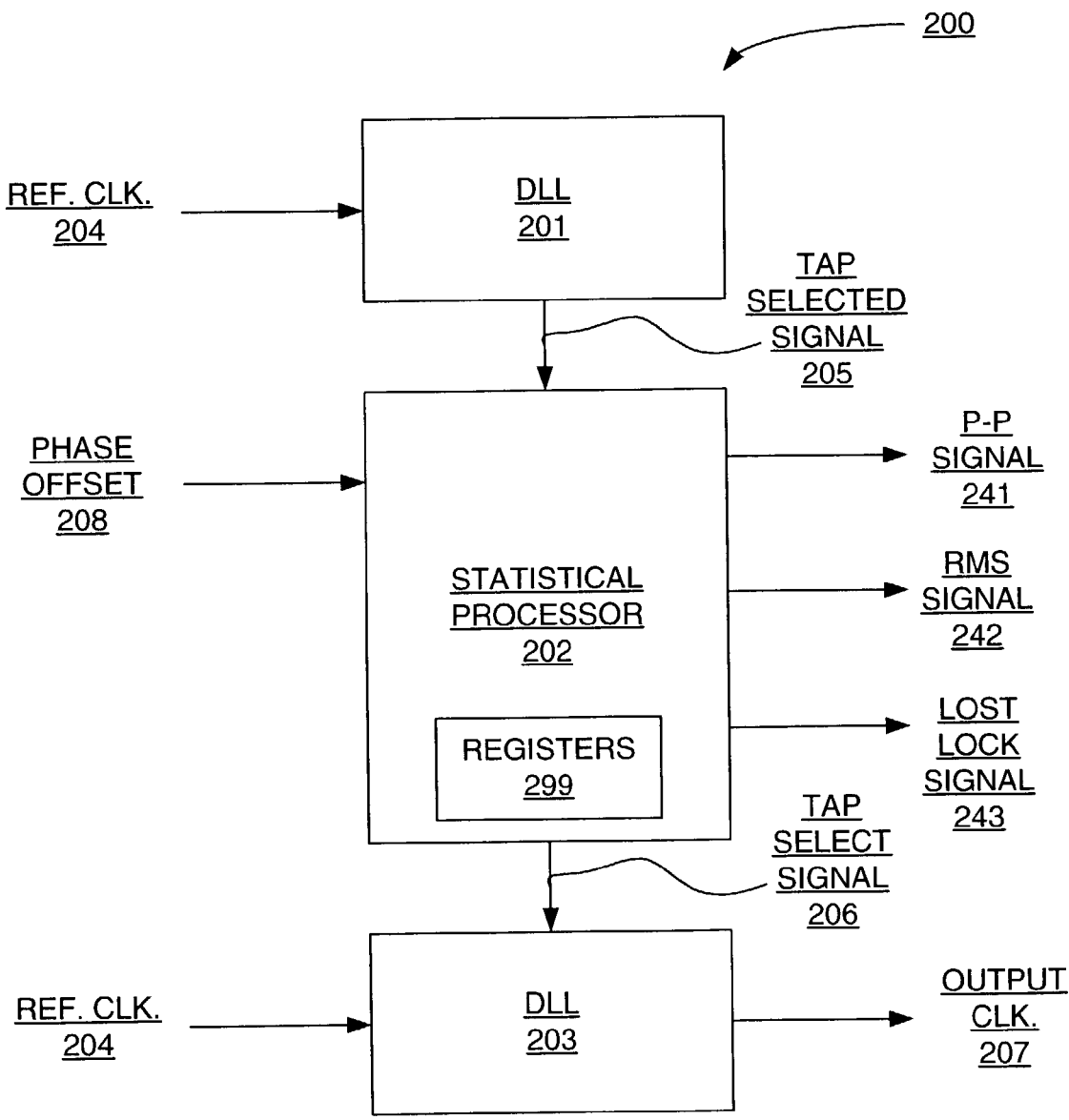
FIG. 2 is a block diagram of an exemplary embodiment of a jitter reduction circuit in accordance with one or more aspects of the present invention.

Referring to FIG. 2, there is shown a block diagram of an exemplary embodiment of a jitter reduction circuit 200 in accordance with one or more aspects of the present invention. Reference clock signal 204 is provided to delay-lock loop (DLL) 201 and DLL 203. DLL 201 locks onto reference clock 204 at a selected tap of a delay line as indicated by tap-selected signal 205. Tap selected signal 205 is provided to statistical processor 202. Statistical processor 202 need not be equivalent to a microprocessor, but rather may be logic implementation including one or more storage elements, such as registers 299, for providing statistical processing in accordance with one or more aspects of the present invention. Moreover, statistical processor 202 may be implemented with hard wired logic or programmable logic, such as programmable logic as in a CPLD or an FPGA. Optionally, a phase-offset signal 208 may be provided to statistical processor 202 to select a particular phase offset for an output clock signal 207, such as a target fixed phase offset.

As mentioned above, statistical processor 202 stores prior tap selections to determine a distribution of taps selectioned to bound such tap selected to reduce the effect of jitter. Accordingly, statistical processor 202 provides a tap select signal 206 to DLL 203. This tap select signal 206 is in response to a selected phase offset 208. For example, if a user decided to have a phase offset of 90°, statistical processor 202 could determine where 0° was from tap selected signal 205 after processing, and calculate another tap to be selected in order to provide a 90° phase offset simply by adding one-quarter of the total number of taps to a tap selected as associated with tap select signal 206.

Tap select signal 206 as mentioned above is provided to DLL 203, along with reference clock signal 204, to provide output clock signal 207. Thus, tap select signal 206 forces DLL 203 to lock to reference clock 204 at a selected tap to provide output clock signal 207.

Accordingly, it should be appreciated that output clock signal 207 is improved over an output clock signal directly from DLL 201, as effects of jitter are limited. Moreover, statistical processor 202 may be configured to determine in response to tap selected signal 205 when a DLL 201 loses lock. For example, if tap selection as indicated by tap selected signal 205 is statistically too far away from an actual mean of tap selected signals as processed by statistical processor 202, a lost lock signal 243 may be provided from statistical processor 202. Moreover, as a distribution of tap selections may be accumulated by statistical processor 202, such as forming a histogram of occurrences of prior selections of each tap according to tap number, peak-to-peak distance between tap selections may be determined and provided as peak-to-peak signal 241. Furthermore, a route mean square (RMS) value for tap selections may be provided as indicated by RMS signal 242.

Figure 3:
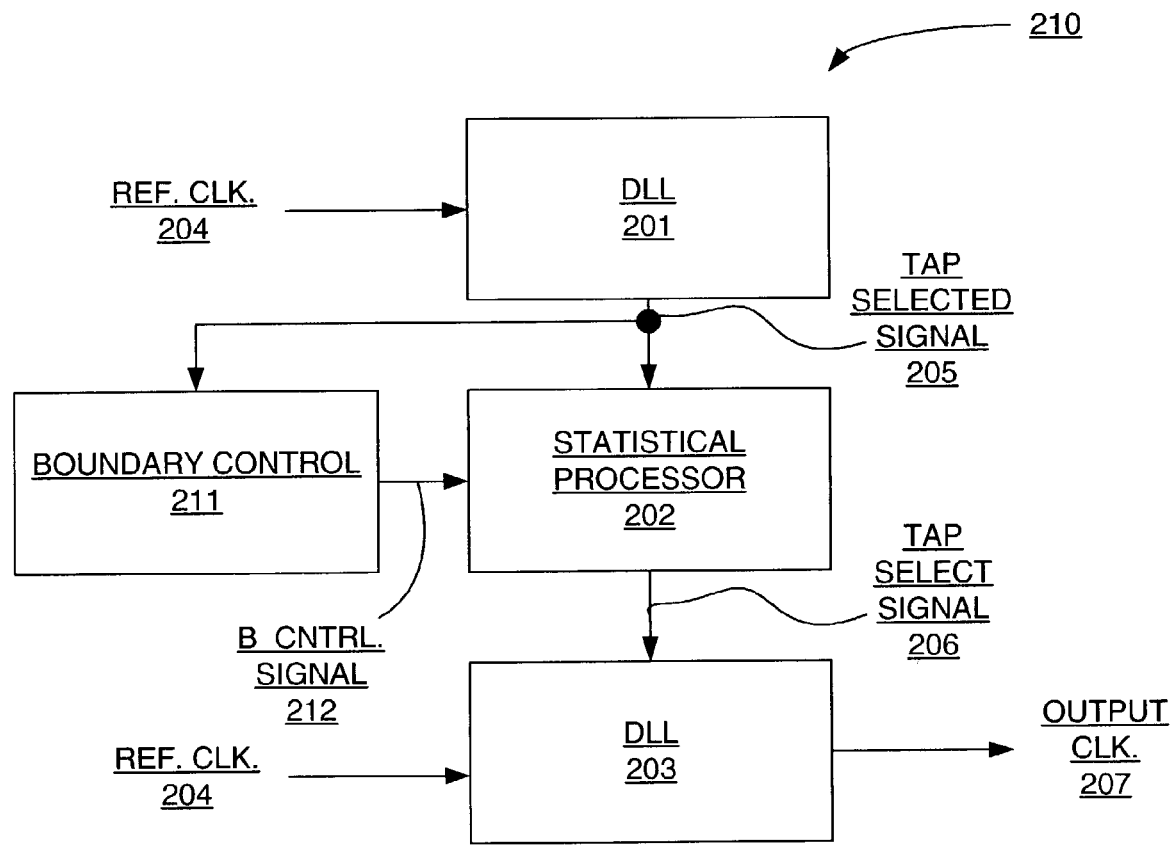
FIG. 3 is a block diagram of an exemplary embodiment of jitter reduction circuit in accordance with one or more aspects of the present invention.

FIG. 3 is a block diagram of an exemplary embodiment of jitter reduction circuit 210 in accordance with one or more aspects of the present invention. Jitter reduction circuit 210, comprises many of the same elements jitter reduction circuit 200 of FIG. 2, with the addition of boundary control 211. Boundary control 211 is coupled to receive tap-selected signal 205. Boundary control 211 is configured to limit tap selected signal 205 to plus or minus X number of taps from a previously selected tap. For example, boundary control 211 may limit tap selection to plus or minus one, two, three, etc. from a previously selected tap, and produce a boundary control signal 211 in response to tap selected signal 205 exceeding a boundary control limit. Boundary control signal 212 may be provided to statistical processor 202 to control selection of a tap to provide tap select signal 206, more particularly, to control statistical processor 202 to limit selection of a tap for tap selected signal 206 within boundary conditions.

Figure 4:
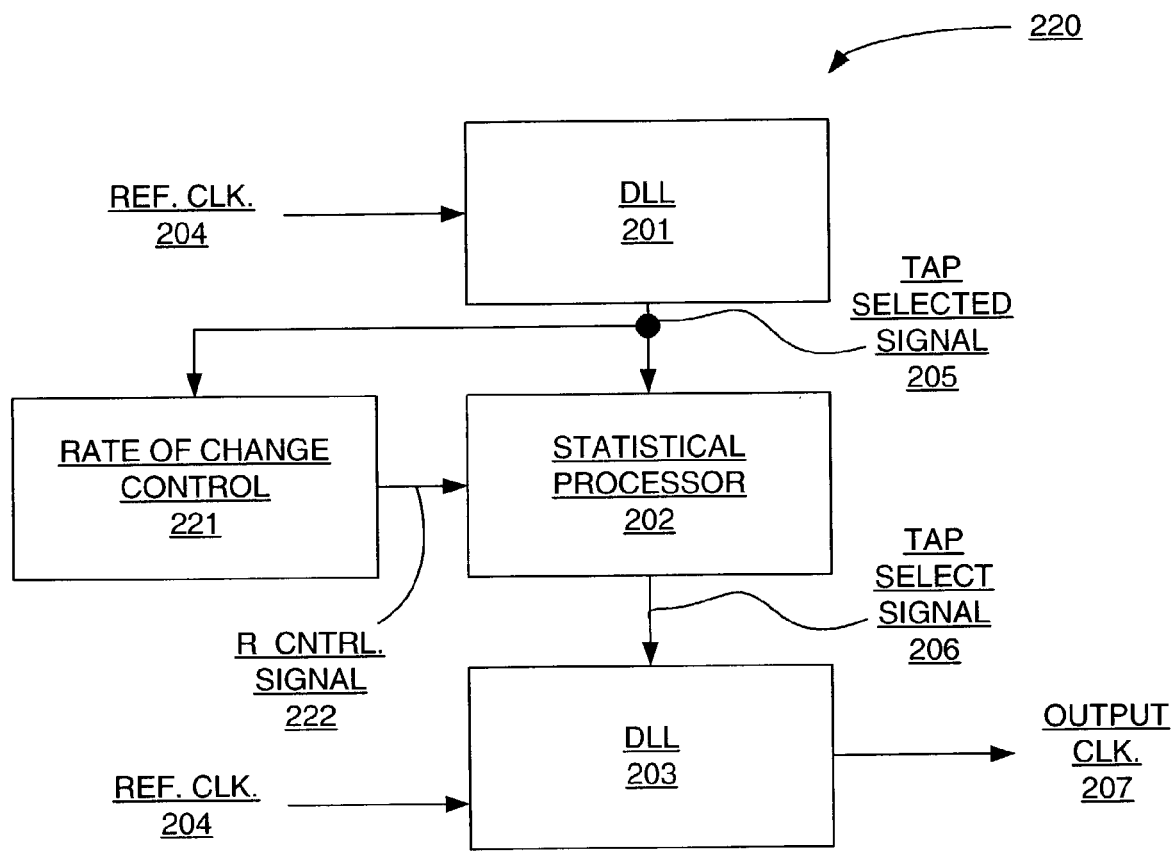
FIG. 4 is a block diagram of an exemplary embodiment of a jitter reduction circuit in accordance with one or more aspects of the present invention.

FIG. 4 is a block diagram of an exemplary embodiment of a jitter reduction circuit 220 in accordance with one or more aspects of the present invention. Jitter reduction circuit 220 is similar to jitter reduction circuit 210 of FIG. 3, except rate of change control 221 is added. Rate of change control 221 is coupled to receive tap-selected signal 205, and to limit rate of change of tap selected signal 205 within predetermined limits. This rate of change control 221 is configured to store prior tap selections in a chronological manner. Rate of change control 221 provides rate control signal 222 when tap selected signal 205 exceeds a rate of change. Rate control signal 222 is provided to statistical processor 202 to limit tap select signal 206 to within a predetermined rate of change.

While the foregoing is directed to the preferred embodiment of the present invention, other and further embodiments of the invention may be devised without departing from the basic scope thereof, and the scope thereof is determined by the claims that follow.

The invention claimed is:

1. An apparatus to reduce effect of jitter, comprising:
    a first delay-lock loop coupled to receive a reference signal and configured to provide a tap selected signal in response to the reference signal;
    a statistical processor coupled to the first delay-lock loop to receive the tap selected signal and configured to provide a tap select signal in response to the tap selected signal, the tap select signal statistically determined from a history of tap selected signals;
    a second delay-lock loop coupled to receive the tap select signal and the reference clock signal, the second delay-lock loop configured to provide an output clock signal in response to the tap select signal.

2. The apparatus according to claim 1, further comprising a boundary control coupled to receive the tap select signal and to provide a tap select bounded signal to the second delay-lock loop to provide the output clock signal.

3. The apparatus according to claim 1, wherein the statistical processor comprises a plurality of registers, the plurality of registers associated with taps of the first delay-lock loop, the plurality of registers configured to store a tap selection of the tap selected signal for the history of tap selected signals, the tap selection being associated with a tap of the first delay-lock loop, the tap selection stored in the plurality of registers for corresponding with the tap of the first delay-lock loop.

4. The apparatus according to claim 3, wherein the plurality of registers are configured to provide a histogram of tap indices for determining the tap select signal.

5. The apparatus according to claim 1, wherein the statistical processor is configured to provide a root mean square tap select signal.

6. The apparatus according to claim 1, wherein the statistical processor is configured to provide a peak-to-peak tap select signal.

7. The apparatus according to claim 1, wherein the statistical processor is configured to provide a lost lock tap select signal.

8. The apparatus according to claim 1, wherein the statistical processor is coupled to receive a phase offset signal and configured to provide the tap select signal responsive to the phase offset signal and the tap selected signal, the tap select signal for providing the output clock signal with a fixed phase offset.

9. A method for reducing effect of jitter, comprising:
storing multiple tap values over time for a first delay-lock loop;
receiving a reference clock signal to the first delay-lock loop;
creating a statistical distribution from the multiple tap values stored;
using the statistical distribution of the multiple tap values stored to set a current tap for a second delay-lock loop to reduce the effect of jitter;
receiving the reference clock signal to the second delay-lock loop.

10. The method according claim 9, further comprising:
determining whether the current tap is within boundary conditions.

11. The method according claim 9, further comprising:
determining a rate of change for the current tap; and
determining whether the rate of change is within acceptable limits.

12. The method according claim 9, wherein the step of using the statistical distribution comprises determining a running average, the running average derived from the statistical distribution to determine an average or a mean.

13. The method according claim 9, wherein the step of using the statistical distribution comprises generating a histogram of tap indices.

* * * * *